United States Patent [19]

Anderson et al.

[11] Patent Number: 5,008,062

[45] Date of Patent: Apr. 16, 1991

[54] METHOD OF FABRICATING PHOTOVOLTAIC MODULE

[75] Inventors: A. Jerome Anderson, Newbury Park; Norman L. Beze, Simi Valley, both of Calif.

[73] Assignee: Siemens Solar Industries, L.P., Camarillo, Calif.

[21] Appl. No.: 318,785

[22] Filed: Mar. 2, 1989

Related U.S. Application Data

[62] Division of Ser. No. 145,931, Jan. 20, 1988, Pat. No. 4,830,038.

[51] Int. Cl.$^5$ .............................................. B29C 45/14
[52] U.S. Cl. .............................. 264/272.15; 264/252; 264/272.16; 264/275; 264/277
[58] Field of Search ............... 264/1.7, 272.15, 272.16, 264/272.17, 252, 275, 277; 136/251, 259

[56] References Cited

U.S. PATENT DOCUMENTS

| | | | |
|---|---|---|---|
| 3,679,949 | 7/1972 | Uekusa et al. | 357/16 |
| 4,336,413 | 6/1982 | Tourneux | 52/173 R |
| 4,401,839 | 8/1983 | Pyle | 136/251 |
| 4,626,185 | 12/1986 | Monnet | 264/252 |
| 4,633,032 | 12/1986 | Oido et al. | 357/78 |

FOREIGN PATENT DOCUMENTS

| | | | |
|---|---|---|---|
| 21874 | 2/1983 | Japan | 136/259 |
| 675147 | 7/1952 | United Kingdom | 264/252 |

OTHER PUBLICATIONS

Carmichael, D. C. et al., Conference Record, 12th IEEE Photovoltaic Specialists Conf. (1976), pp. 317-331.
Hartman, R. A., Conference Record, 18th IEEE Photovoltaic Specialists Conf. (1986), pp. 1190-1194.
Sweeney, Melvin, Reaction Injection Molding Machinery and Processes (1987), Marcel Dekker Inc. NY pp. 1-11.

Primary Examiner—James Lowe
Attorney, Agent, or Firm—Nilsson, Robbins, Dalgarn, Berliner, Carson & Wurst

[57] ABSTRACT

A photovoltaic panel is supported, sealed and isolated from the environment by being encased in a reaction injection molded elastomer which encapsulates the back, sides and a portion of the front side of the photovoltaic panel.

7 Claims, 2 Drawing Sheets

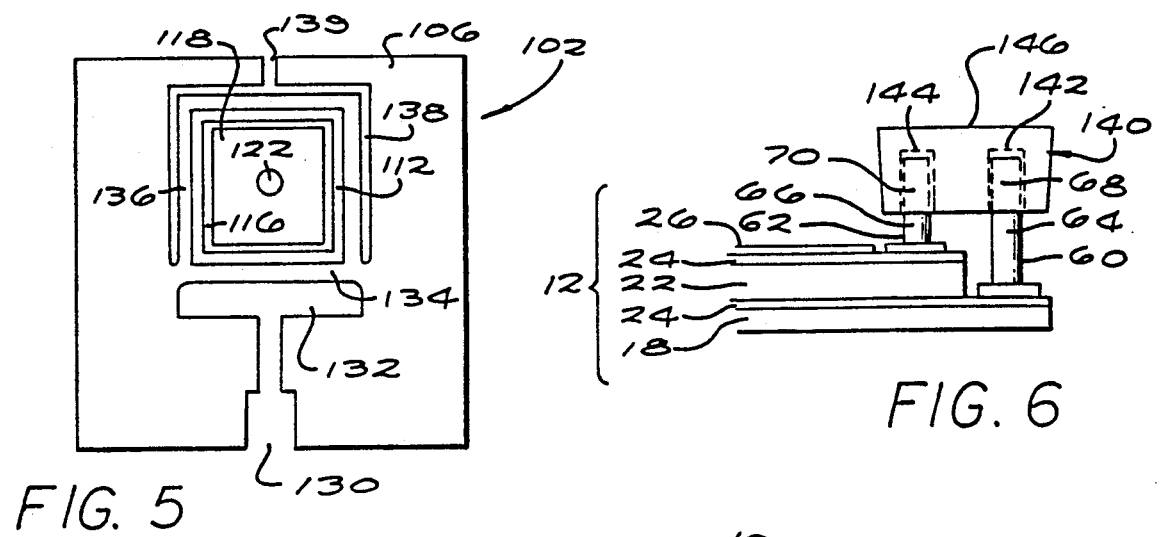
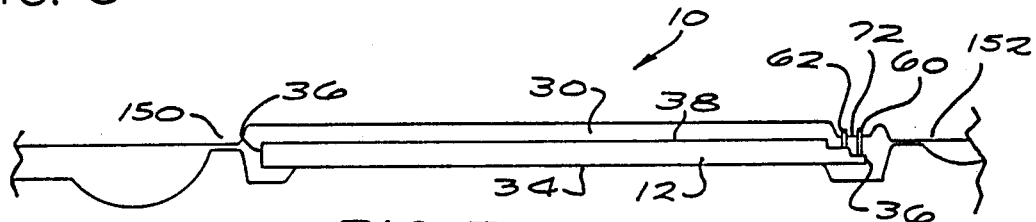
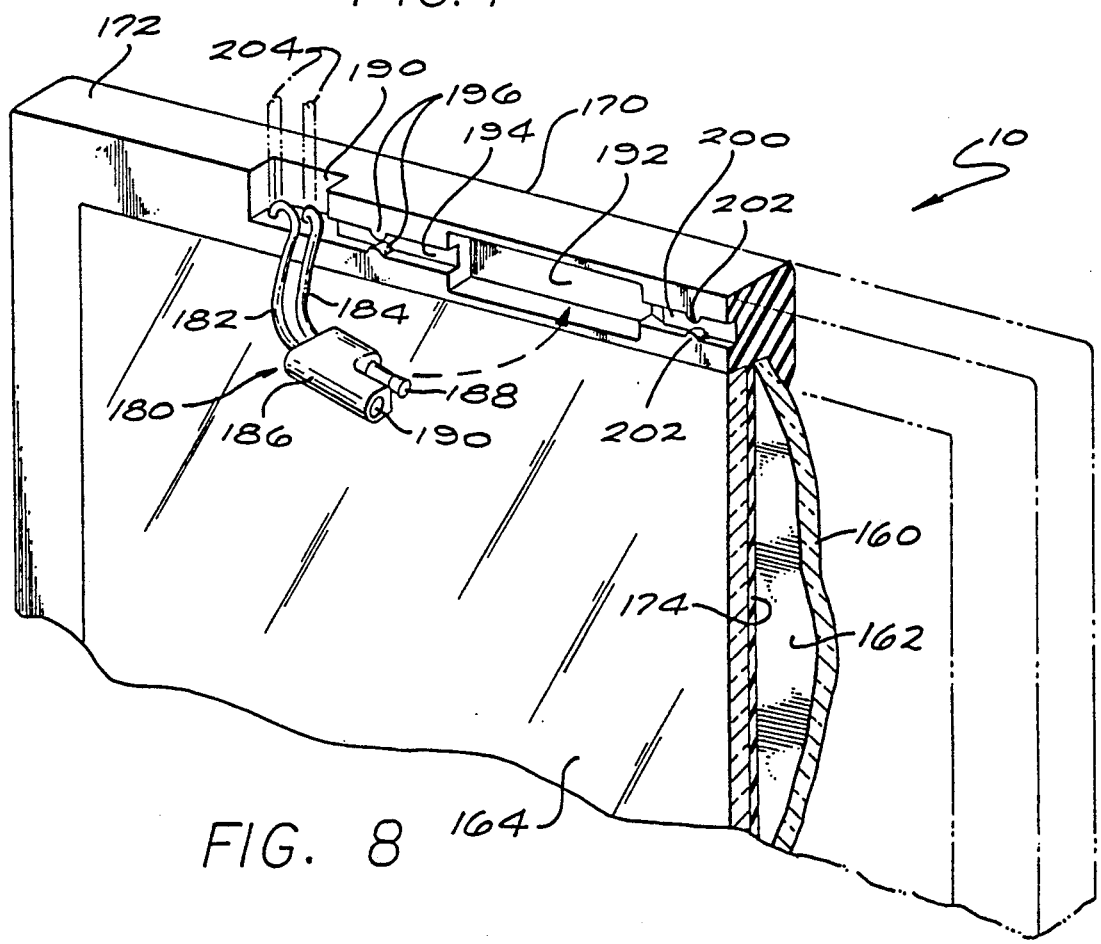

METHOD OF FABRICATING PHOTOVOLTAIC MODULE

This is a divisional application of application Ser. No. 145,931, filed Jan. 20, 1988, for "Photovoltaic Module" and now U.S. Pat. No. 4,830,038.

FIELD OF THE INVENTION

The invention relates to a method of fabricating photovoltaic cells for converting light into electrical energy and more particularly to a method of fabricating an elastomer-encased photovoltaic panel using reaction injection molding techniques.

BACKGROUND AND SUMMARY OF THE INVENTION

It has long been desirable to capture radiation, particularly visible light, to convert it directly into electrical energy through the utilization of photovoltaic cells. Many types of photovoltaic cells, often referred to as solar cells, have been considered and constructed. For example, single-crystal cells have been produced, as well as those produced from gallium arsenide and other similar materials. In addition, thin film cells have been fabricated from microcrystalline, amorphous, compound or semiconductor material other than single crystal semiconductor material, deposited in situ upon a substrate by chemical vapor deposition, sputtering or other similar means. In use, these cells are assembled in photovoltaic panels and modules which must withstand the rigors of the environment and handling in commerce.

As used herein, the term photovoltaic panel refers to a combination of a sheet of transparent material or other lamina, an array or group of photovoltaic cells interconnected to provide an output of electrical energy, and any backing sheet or material, which forms a device capable of transforming incident radiation to electrical current. Such panels are traditionally comprised of a transparent front or radiation-facing sheet such as a glass or transparent polymer, laminated with layers of transparent conductors, photovoltaic materials, cell-connecting circuits, metals and other lamina which together comprise an operative photovoltaic panel. Thus, photovoltaic panels have traditionally included a sheet of glass or other rigid transparent material to protect the photovoltaic cell, and a back sheet of steel or aluminum metal or foil, with the various lamina being bonded together by a dielectric layer of plasticized polyvinyl butyryl or ethylene vinylacetate In instances where a totally transparent photovoltaic panel is desired, such as in a solar cell which serves as an automobile sun roof, a front and back sheet both of rigid transparent material is employed.

After the initial assembly of the laminates which comprise the photovoltaic panel, the edges of the panel have traditionally been smoothed to provide a flush edge surface, and sealed with a non-conductive varnish followed by one or more layers of polyester and/or polyurethane tape. After this sealing of the edges, the panel is enclosed in a peripheral frame of aluminum, steel, molded polymer or other rigid frame material This method of sealing and framing the periphery of the panel has been necessary to isolate the solar cell from the environment, and to provide a frame for the strengthening of the panel and to provide a border to permit ease of handling and the attachment of connector boxes and the like for attachment of the photovoltaic cell to an external electrical circuit. For example, a solar panel with a hardened foil back layer sandwiched between polyvinyl fluoride resin sheets, and framed in rigid peripheral framing is shown in U.S. Pat. No. 4,401,839. This combination of a photovoltaic panel with the frame, sealing means, connection means and ancillary supporting structures is referred to herein as a photovoltaic module.

While existing methods for the production and framing of photovoltaic panels have provided significant improvements in solar cell technology over the years, it has been a desideratum to simplify the lamination and manufacture of such panels and provide for a stronger module and a more perfect seal to protect the edges or back panel of photovoltaic panels. For example, the lamination steps have previously required a considerable expenditure of labor, and the metal backing sheets previously used to protect the back of the panel may allow electrical leakage which turns a photovoltaic cell into a capacitor.

A thin film photovoltaic module produced by the method of the invention has a panel with front and back sides and edges forming a perimeter and at least one photovoltaic cell capable of converting radiation incident on the front of the panel to electrical energy, the panel being partially encapsulated in a unitary, reaction-injected molded elastomer which forms a seal against a portion of the front side of the panel bordering the perimeter, and continues around the perimeter and seals against at least a portion of the back side. In one embodiment, the module fabricated by the method of the invention further comprises means for establishing external electrical connection to the photovoltaic cell, including an internal portion electrically connected to the cell and an external portion extending from the panel, and the unitary elastomer further encapsulates at least the internal portion of such connecting means.

The method of the invention involves placing a thin film photovoltaic panel in a mold having interior walls which cooperate with a predetermined portion of the module to define a cavity encompassing the perimeter and at least a portion of the front and back of the panel, introducing a flowable reaction injection molding material into the cavity and curing the material to form the casing. For example, the panel could be placed in a mold including two cooperating mold sections having surfaces defining a chamber for receiving the panel, with one of the mold sections having seal means positioned to be adjacent the periphery of the front side of the panel to support the panel within the panel receiving chamber and seal the portion of the panel located interiorly of the seal means against the influx of fluid. The facing surfaces of the mold sections located exteriorly of the seal means are provided with a casing shaping portion which cooperates with the seal means and the predetermined portion of the panel to define a cavity when the mold sections are in contacting relationship.

The mold also includes inlet means for introducing the flowable reaction injection molding material into the cavity when the mold sections are contacting to form a closed mold. The casing shaping portion of the mold may also define a cavity portion which includes at least the internal portion of the connecting means of the panel so that a portion of the connecting means is imbedded in the cured reaction injection molding material. Preferably, the reaction injection molding elastomer encapsulates the back and perimeter edges of the panel and forms a seal against a portion of the front side of the panel bordering the perimeter. If desired, a stiffening structure such as metal, fibrous or polymeric sheets or girders may be included within the elastomer to add to the rigidity of the photovoltaic module.

In a preferred embodiment, the module produced by the method of the invention comprises a first sheet having a first radiation-incident side and having a photovoltaic cell formed thereon; a second backing sheet, preferably having a comparable modulus of thermal expansion, adjacent and spaced from a back side of the first sheet; and a unitary, reaction injection molded elastomer disposed between the back side of the first sheet and the second, the elastomer partially encapsulating the first sheet, forming a seal against a portion of the front side of the first sheet bordering the perimeter, continuing around the perimeter of the first sheet and sealing against at least a portion of the second sheet. The term unitary elastomer, as used herein, refers to a one-piece elastomer, one that is formed by a single injection of an elastomer-forming material as described.

BRIEF DESCRIPTION OF THE DRAWINGS

FIG. 5 is an overhead view of the mold section 102;

FIG. 6 is a partial sectional view showing the means for forming junction box or connecting cavity 72 of the module shown in FIG. 2;

FIG. 7 is a vertical sectional view of the module assembly produced by the mold shown in FIG. 4 after demolding and prior to trimming of the flash and runner polymer sections; and FIG. 8 is a fragmented, sectional perspective view of an alternative embodiment of the invention.

DETAILED DESCRIPTION

Figure 1:
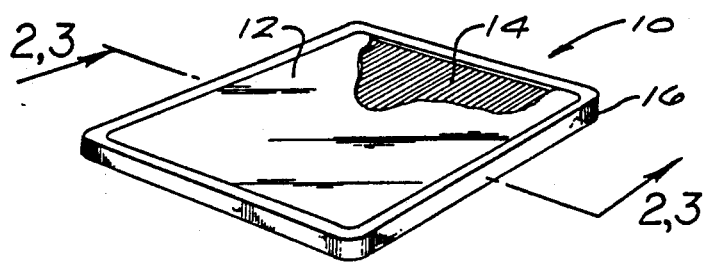
FIG. 1 is a perspective view of a photovoltaic module fabricated in accordance with the method of the present invention.
Figure 2:
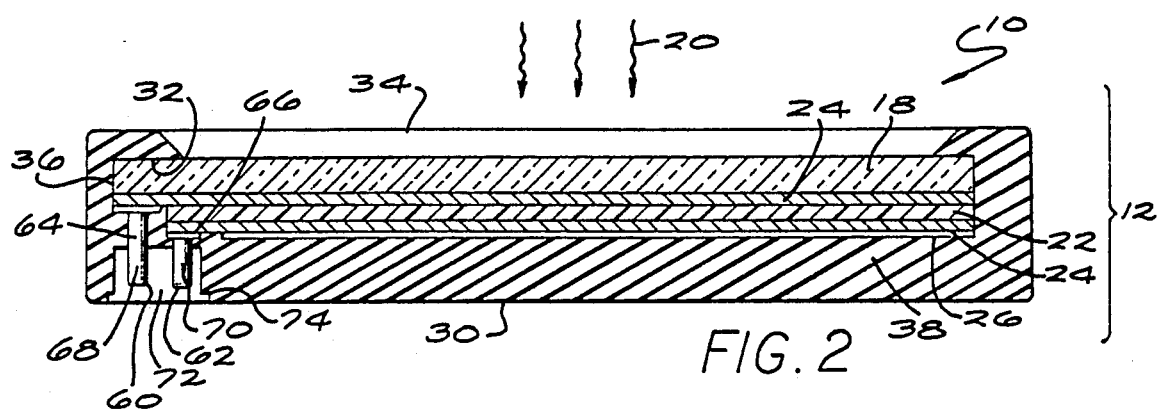
FIG. 2 is a schematic vertical sectional view of a first embodiment taken along line 2—2 of FIG. 1.
Figure 3:
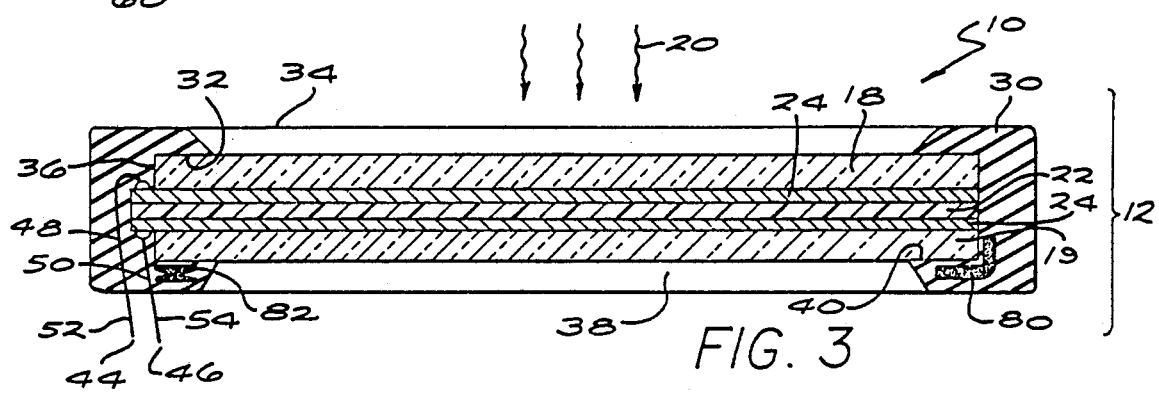
FIG. 3 is a schematic vertical sectional view of a second embodiment taken along line 3—3 of FIG. 1.

A wide variety of photovoltaic panels may be encapsulated in an elastomer produced by reaction injection molding (RIM). Any such panel having a front transparent substrate bearing at least one photovoltaic cell may be advantageously encapsulated according to the invention. In the preferred embodiment, there is illustrated in FIGS. 1-3 a thin film photovoltaic module fabricated by the method of the present invention, designated generally 10. The module 10 comprises a laminated central panel 12, including an array of photovoltaic cells 14, surrounded by a border 16 which is formed from a RIM elastomer. Turning now to FIG. 2, the module 10 is seen to include a transparent sheet or substrate 18, formed from various materials such as glass or transparent polymers, through which incident light illustrated at 20 passes. The module 10 includes a thin film semiconductor material 22. The thin film material 22 may be, for example, a PIN microcrystalline thin film silicon-hydrogen cell array, a thin film amorphous silicon panel or an array of single crystal photovoltaic cells. Methods for the production of photovoltaic panels are known in the art and will not be discussed further herein, other than to incorporate by reference U.S. Pat. No. 4,638,111 to Gay. The RIM process is particularly advantageous in encapsulating photovoltaic panels since RIM is a thermosetting polymer formed from the reaction of injected liquid polymeric precursors at low temperature (less than 200° F.), thus preventing heat damage to the thin film material which would occur if high temperature injection molding techniques were employed. In addition, the use of the RIM elastomer permits the insertion of various fastener receiving means in the elastomer during the molding process, as will be apparent from the following description, which will accept fasteners for the attachment of the module to various structures.

On either side of the thin film semiconductor material 22 are thin films of electrical conductors 24 which are patterned with a laser or otherwise, and staggered to form front and back overlapping electrodes which collect charge from the cell array in series. For example, a film of zinc oxide or indium tin oxide (ITO) may be employed for a transparent front film. Aluminum and/or nickel for a non-transparent or zinc oxide or ITO for a transparent back film may be employed. Methods for the production and utilization of such conductor films are also known in the art. If the bottom conductor layer 24 is transparent a partially reflective layer 26, for example, a coating such as a layer of white or light-colored paint, may be used which causes a portion of the incident light to be reflected again through the thin film semiconductor material 22 after striking the reflective layer 26.

In FIG. 2, a unitary elastomer 30 is seen to encapsulate the photovoltaic panel 12, forming a seal against a portion 32 of a front side 34 bordering a perimeter 36 of the panel 12, and continuing around the perimeter 36 and sealing against a back side 38 of the panel 12. The encapsulation of all but the light incident portion of the front side 34 of the panel 12 is a significant benefit since it eliminates the lamination step previously required in the assembly of photovoltaic modules.

In FIG. 3 only a portion 40 of the back side 38 which is adjacent the perimeter 36 is encapsulated by the elastomer. In this Figure, the panel 12 is seen to include the transparent sheet 18, thin film material 22 and transparent electrical conductors 24 as described above in FIG. 2. Behind these lamina, an additional transparent sheet 19 is included which protects the lamina 22 and 24 which comprise the array of photovoltaic cells and permits the further transmission of the incident radiation through the panel 12 as shown to provide a totally transparent panel.

In FIG. 3, the charge-carrying transparent conductors 24 are seen to extend from the left edge of the panel 12, where they are connected by soldering or otherwise to means for establishing external electrical connection to the panel 12, here shown as leads 44 and 46. These leads are seen to include internal portions 48 and 50, which are encapsulated by the unitary elastomer 30, and external portions 52 and 54 which extend from the elastomer 30 for connection to an external electrical circuit, not specifically shown, for utilization of the current produced by the photovoltaic module 10. In both FIGS. 2 and 3, the internal edge portion of the elastomer 30 which is adjacent the front of the panel 12 tapers outwardly from the panel to permit rain water or condensation to drain easily from the front of the panel when the module is placed in operating position, that is, angled toward the sun.

In a similar manner which will be recognized by those skilled in the art, FIG. 2 shows an electrical connection means comprising connectors 60 and 62 having internal portions 64 and 66 connected to the transparent conductors 24, which establish the circuit within the photovoltaic panel 12, by soldering or other means which are known in the art. The internal portions 64 and 66 are seen to be embedded in the elastomer 30 so that the internal laminations of the panel 12 are sealed against the penetration of moisture, and the connectors 60 and 62 are thus held in congruence with the conductors 24. The connectors 60 and 62 also include external portions 68 and 70 which extend from the internal portions 64 and 66 into an essentially square cavity 72 formed in the elastomer 30. This cavity 72 serves as a terminal box or junction box for use with a connector plug or cover plate whereby the connectors 60 and 62, and the connections therewith, are isolated from the environment. For example a cover plate, not shown, bearing sealed wires for connection to an external electrical circuit may be inserted in the recess 74 provided about the edges of the cavity 72 and secured by adhesive or other fastener means. If such wires are employed, the external portions 68 and 70 may be threaded or otherwise adapted to receive wire-connecting means. Alternatively, the cavity 72 may be adapted to receive an elastomeric plug which, in turn, receives the external portions 68 and 70 for connection with the external circuit. The general construction of terminal assemblies for prior art photovoltaic panels is known in the art, and a particularly useful assembly is shown in U.S. Pat. No. 4,371,739 to Lewis, et al., which is incorporated herein by reference.

Significant advantages are provided through the use of the RIM elastomer module-forming method in that significant additional rigidity may be provided to the photovoltaic module 10. For example, the thickness of the unitary elastomer overlying the back side 38 in FIG. 2, as well as the uniform sealing of the elastomer against the abutting portions of the panel 12, add significant rigidity to the photovoltaic module 10. Structural ridges formed in the elastomer 30 across the back side 38 may be employed to add significant structural stiffness without increasing the weight of the module. Alternatively, internal structural members may be employed to stiffen the module. For example, FIG. 3 shows an L-shaped stiffening structural member 80 at the right side of the drawing, and an I-beam shaped stiffener 82 at the left. The stiffeners 80 and 82 are shown in the drawing as being formed from carbon fibers, although a wide variety of shapes, sizes and materials may be employed for the structural reinforcing members. For example, these members may be made of polymeric material, steel or aluminum.

While reaction injection molding (RIM) has not previously been employed in the encapsulation of photovoltaic panels, RIM is a well established process for molding block polymers, and a wide variety of RIM machines is in existence and known in the art. The RIM machine meters, mixes and dispenses reactive chemicals into a mold, where a chemical reaction occurs and the desired part is formed. Polyurethanes, polyamines, epoxies, polyesters, nylon and hybrid block polymers may be formed by RIM technology and adaptable to the formation of the elastomer-encapsulated photovoltaic panels of the invention. With respect to the polymers formed around the photovoltaic panels, an elastomer is preferred to minimize unequal thermal expansion which might otherwise stress the laminations of the photovoltaic panel or break the glass substrate of the panel. Preferably, an elastomer having a modulus of elasticity of from 200 to 10,000 p.s.i. is preferred. Since polyurethane technology is developed and easily adaptable to the encapsulation of photovoltaic panels, the use of polyurethane resins in RIM technology will be discussed in this preferred embodiment. However, other polymer systems are equally adaptable to the invention upon the reading of this description. A description of the RIM technology for a wide variety of polymers is set forth in Sweeney, *Reaction injection Molding Machinery and Processes,* Marcel Dekker, Inc., New York (1987) and Kresta, *Reaction Injection Molding and Fast Polymerication Reactions,* Polymer Science and Technology, Volume 18, Plenum Press, New York (1982). Both of these publications are incorporated herein by reference.

Commercial RIM polyurethane polymer precursors are based on isocyanates, polyols, extenders, catalysts and blowing agents. The extenders are usually glycols or amines or some combination of the two. The most common isocyanate is diphenylmethane diisocyanate (MDI) and has been found to be a preferred isocyanate in the production of the photovoltaic modules of the invention. The polyol may be either a polyether or polyester chain compound having reactive hydroxyl end groups. Preferably, a polyol comprising a mixture of diol-triol, or an all triol polyol, having a molecular weight of about 4,000 is preferred. Diamine extenders such as diethyl toluene diamine have been found to be particularly useful, as have triamine catalysts, organotin or tin oxide catalysts. The elastomers of the invention may be either solid elastomers, or include a freon expanding agent to form a foam or semi-foam elastomer. Either the solid or expanded elastomer is equally adaptable to encapsulating the photovoltaic panels of the invention. In addition, a wide variety of fillers may be employed to form a reinforced reaction injection molding (RRIM) elastomer. Fillers such as carbon black or fine limestone may be added as pigments to the elastomer. Plate-like fillers such as the mineral wollastonite may be employed as reinforcing fillers. In addition, needle-like or long fibrous fillers such as glass fibers may also be employed to provide structural rigidity to the elastomer.

Solid elastomers or structural RIM foam are equally adaptable to the invention. Solid elastomers are formulated with no expanding agent and the mold is completely filled with the polyurethane precursors. Structural foam is produced by using a chemical system containing a relatively large amount of an expanding agent such as a liquid fluorinated hydrocarbon of the type available under the trademark FREON. Heat from the chemical reaction vaporizes the expanding agent, causing the reactants to foam, adding additional expansion pressure to fill and pack the mold. The rate of the polymerization reaction is adjusted catalytically to allow the foaming to occur before viscosity increases excessively.

Polyurethane precursors which are prepared specifically for use in reaction injection molding are available from BASF Wyandotte Corporation, Dow Chemical Company, ICI, Mobay Chemical Corporation, Olin Chemical Company, Texaco Chemicals, Union Carbide Corporation and the Upjohn Company. RIM polyurethane preparations sold under the trade names Mobay MP 5000 and Dow Spectrim 5 have been found to be particularly useful in the encapsulation of solar panels.

RIM machines for dispensing reactants are available from a number of suppliers, and are widely known and used in the art for the formation of a wide variety of products. One source for RIM machines is Admiral Equipment, Incorporated of Akron, Ohio. The RIM dispensing machine performs four functions: (a) conditions the elastomer precursors to control density and viscosity, (b) meters the precursors as required by the stoichiometry of the chemical system, (c) mixes the reactants by high pressure impingement within the mixing head, and (d) recirculates the reactants to maintain pressure, density and viscosity. The metering pumps on RIM machines may be linear, axial or rotary piston pumps, or lance pistons. The elastomer precursors are fed at high pressure to a mixing head Which mixes the reactants by impingement during shots, recirculates the reactants between shots, develops the pressures needed for good mixing and self-cleans the mixing chamber using a cleanout piston.

As mentioned, the mixing of the reactants occurs in the mix head and continues after injection within the mold. The mold shapes the part, directs reactants into the mold cavity, directs the flow of reactants, controls the exotherm temperature produced by the molding process by removing heat, and contains devices to facilitate holding the part to be molded in position and facilitating part removal.

Figure 4:
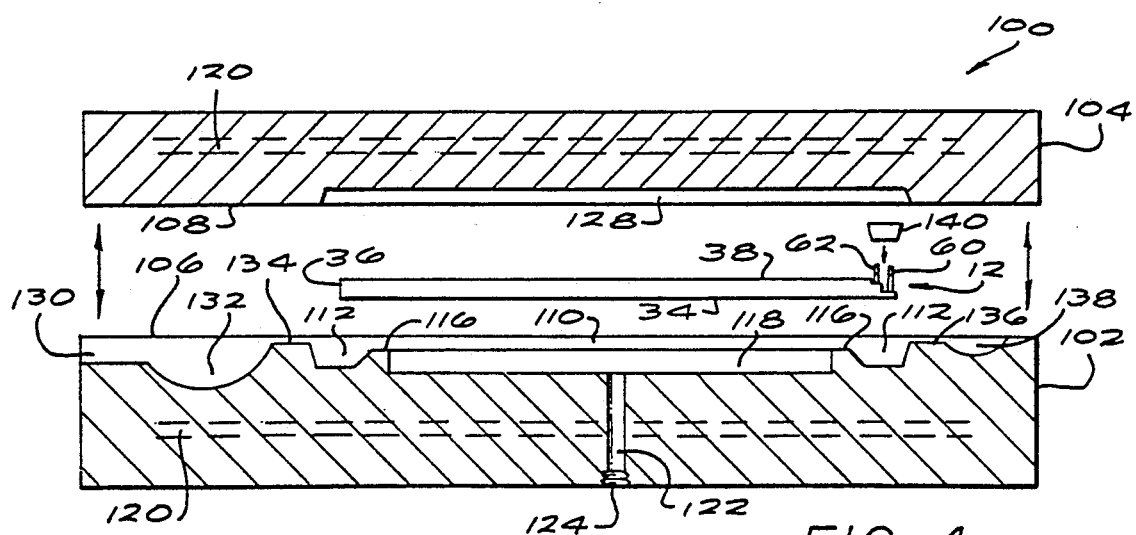
FIG. 4 is a vertical sectional view of mold sections which are employed to produce the photovoltaic module shown in FIG. 1.

FIG. 4 shows a cross-sectional view of a mold 100 for forming an encapsulated thin film photovoltaic panel according to the method of the invention. The mold 100 includes a first mold section 102 and a second mold section 104 which have facing surfaces, detailed more specifically herein, which cooperate to define a chamber for receiving the photovoltaic panel 12 and forming an encapsulated elastomer around the panel. An overhead view of the mold section 102 is shown in FIG. 5. The mold sections 102 and 104 are seen to be adaptable to be brought into a contacting relationship wherein facing surfaces 106 and 108 abut. Mold carrying clamps for this purpose are known in the art and may comprise hydraulic or mechanical means for moving the mold sections in opposite directions as shown in FIG. 4, or may involve a hinged book-type opening method. Such mold clamps provide the forces which hold the mold together during filling, provide the breakaway forces necessary to open the mold after the reactants have polymerized, move the mold from a loading position to a shot position during the molding cycle and open and close the mold for insertion of materials and removal of the polymerized part. One source for such mold carrying devices is Urethane Technology, Incorporated of Grand Haven, Mich.

A chamber for molding the encapsulated photovoltaic module 10 which is shown broadly in FIG. 2 is defined in FIG. 4 by a cavity 110 in the mold section 102. The cavity 110 includes a border cavity portion which encompasses the perimeter 36 of the panel 12 and overlies a portion of the front side 34 of the panel 12 bordering the perimeter 36. Seal means 116 are positioned in the mold section 102 to be adjacent the periphery of the front side of the panel 12, when the panel is in place within the mold 100, to support the panel and seal the portion of the panel 12 located interiorly of the seal means, that is, the area of the front surface 34 above and interior cavity portion 118, against the influx of the reactive molding fluid.

Several types of material may be used to make RIM molds. Epoxy molds are easy to make and inexpensive compared to metals, but suffer from a low heat transfer rate and a high coefficient of thermal expansion. Most commonly, metal molds such as nickel shell, spray metal, cast aluminum, cast zinc alloy (Kirksite), machined aluminum or machined steel are preferred. Regardless of the mold material employed, it may be desirable to include a plurality of tubes or passages, shown schematically by the reference numeral 120 in FIG. 4, which are uniformly spaced throughout the mold sections and provide for the circulation of a heat-transfer fluid in order to control the temperature at appropriate portions of the mold to control chemical reaction rates. The seal means 116 and other cavity-defining portions of the mold are preferably machined or otherwise formed from metal, although resilient seal means such as silicone rubber seals may be employed.

During the molding process, the panel 12 is held against the seal means 116 by a vacuum in the interior cavity portion 118 which is produced, in the mold shown in FIG. 4, by a vacuum chuck means 122, or a plurality of individual vacuum cups, are employed to hold the panel 12 in a sealing relationship with the seal means 116. The vacuum chuck 122 is seen to include a threaded tap 124 for attachment of a vacuum hose, not shown. When the panel 12 is thus held against the seal means 116 and the mold sections 102 and 104 are brought into an abutting relationship, a core portion 128 of the mold section 104 is seen to be adapted to form a portion of the elastomer 30 which overlies the back side 38 of the panel. If a transparent module such as that shown in FIG. 3 is desired, a module wherein the elastomer borders only a portion of the back side 38 of the panel 12, seal means similar to the means 116 are included in the core 128.

The mold section 102 also includes an inlet sprue 130, which is adapted to receive the mixing and injection valve of the RIM machine, not specifically shown. Communicating with the sprue 130 is a runner 132 which preferably extends longitudinally along the length of the panel 12 and which is adapted to receive the incoming fluid from the sprue 130. Upon filling, the runner 132 creates a reservoir of increased pressure whereby the fluid elastomer precursors quickly flow over a restricted inlet gate 134 into the nearest border cavity portion 112 and the core 128 of the mold section 104. The inlet gate 134 provides a clearance against the facing surface 108 of about 30/1000ths of an inch. Thereafter, the fluid fills the circumferential border cavity 112 and flows over an outlet gate 136, on three sides of the panel, and into a dump well 138. It should be understood that gates 134 and 136 cooperate to extend around the periphery of the border 16 of the module 10 to form flash portions of the elastomer which are then trimmed from the module. An exit sprue 139 for excess elastomer-forming reactants may also be provided leading from the dump well 138. It should be understood that the abutting perimeter portions of the mold sections 102 and 104 provide sufficient clearance for the escape of air from the mold cavity. Generally, a clearance of from 5/1000ths to 10/1000ths of an inch is sufficient clearance between the mold sections at 136 to allow the escape of air during the influx of the fluid.

It will be appreciated by those of skill in the art that mold design can vary significantly with respect to the dumping of excess elastomer-forming precursors, depending on factors such as the size of the panel to be encapsulated and the particular formulation employed. For example, while panels have been formed using the peripheral dump well 138 as is shown in FIG. 5, other panels have been formed in molds wherein the dump well is deleted and the border cavity 112 communicates across the outlet gate 136 directly with the exit sprue 139. Other molds have been employed wherein the mold-facing surfaces 106 and 108 are in such close contact at the gate 136 that virtually all of the elastomer flows through a single exit sprue. This provides for significant advantages in demolding and finishing the encapsulated photovoltaic module. Such variations will be apparent to those with skill in the art without departing from the spirit of the invention.

The mold sections 102 and 104 may also be adapted, according to means known in the art, to form the cavity 72 or other portions of the elastomer 30 necessary to form connector means or junction boxes around the external portion of the terminal assemblies which are electrically connected to the panel 12. For example, to form the cavity 72 in FIG. 2, an essentially square (from an overhead view) mold plug 140, shown in FIG. 4 and in some detail in FIG. 6, is inserted over the terminal means. The plug 140 may be made from a resilient material which is coated with a mold-released formulation, and is seen to include cylindrical perforations 142 and 144 which cover and seal against the exposed, external portions 68 and 70 of the connectors 60 and 62. When the mold sections 102 and 104 are closed, a top 146 of the mold plug 140 is seen to contact the top of the core 128 so that the cavity 72 in the elastomer 30 (as shown in FIG. 2) is formed. Other means for forming connector means or terminal boxes will be apparent to one of ordinary skill in the art having read this disclosure. It is to be noted with respect to the plug 140 that the edges thereof are tapered inwardly at a draft angle of at least 1.5°, and preferably from 3° to 5° from perpendicular. This draft angle should also be noted with respect to the edges of the elastomer 30 in FIGS. 2 and 3. Similar draft angles are also shown with respect to the cavity 110 and the core 128 in FIG. 4.

Should it be desired to include structural means such as those shown by the reference numerals 80 and 82 within the elastomer, these members are attached, by elastomeric adhesive or other means, to the panel 12 and the incoming elastomer-forming fluid easily flows about the structural members and any voids between the members and the panel to form a rigid, stiffened solar module.

In the method of the invention, the glass or transparent polymer with the photovoltaic cells or films attached, as well as the structural stiffening members and terminal members if desired, is first primed in all areas to which the elastomer is to adhere. This prime coating may or may not be tinted to provide a partially reflective coating to the photovoltaic panel such as that shown by the reference numeral 26 in FIG. 2. The primer is deposited about ¼ of an inch around the edge of the front surface of the panel, the edges and the back. If a transparent panel is desired, only a portion of the back surface is primed and coated with elastomer. Primers for use in reaction injection molding are known in the art, but the inclusion of an amino-silane coupling agent is preferred. Epoxy-silane is also useful as is any other molecule having a portion which bonds to the elastomer and another portion which bonds to the panel. Following the priming of the panel, the mold cavity is sprayed with a mold release agent which may include a paint which colors the exterior of the elastomer. Such in-mold coatings are also known in the art.

Following the priming of the panel and the in-mold coating, the primed panel is placed in the mold, the mold closed and clamped, and a vacuum applied to the vacuum chuck means to hold the panel securely against the seals. The clamped mold is then rotated to position the air vents at the highest point, usually with the fluid input at the lowest point, and the fluid elastomer precursors are mixed in the mix head during the injection process and the reacting solution is injected into the inlet sprue. The impingement pressure necessary to mix the incoming streams of polyurethane-forming precursors in the mix head is about 2,000–3,000 p.s.i., although the pressure in the mold cavity after flow through the runner and across the inlet gate is only about 20–50 p.s.i. During the polyurethane-forming reaction, the temperature produced by the polyurethane exotherm is maintained at about 150–160° F. by the mold and the heat transfer fluid in the passages 120. The volume of the fluid injected into the mold is calculated so that the elastomer-forming fluid fills the mold cavity, extends across the land or flash areas above the peripheral gates 134 and 136, and penetrates slightly into the dump well. Following the curing of the elastomer, which generally occurs within thirty seconds, the encapsulated panel is removed when the mold opens. If desired, knockout pins or knockout pads may be inserted in the mold section which retains the panel to facilitate part removal. After removal from the mold, the encapsulating elastomeric material has a form which is shown schematically, in cross-section, in FIG. 7. The panel 12 is there shown to be encased in a unitary elastomer 30 which extends across the back side 38 of the panel 12, around the perimeter 36 and overlying and sealing against a portion of the front side 34 of the panel bordering the perimeter. The portion of the elastomer which has cured within the inlet sprue 130 and the runner 132 is seen as being attached to the module 10 by an inlet flash portion 150. The portion of the elastomer which has escaped into the dump well 138 is seen to be attached to the module 10 by a peripheral outlet flash portion 152. These flash portions are thereafter trimmed or torn from the module 10 as is known in the art.

A particularly advantageous embodiment of the module 10 is shown in FIG. 8. In this figure, the module 10 is seen to include a first or front transparent sheet 160, having front and back sides and edges forming a perimeter as described above with respect to the sheet of substrate 18, FIGS. 2 and 3 and having an plurality of photovoltaic cells 162 arrayed on the back side thereof which are capable of converting radiation incident on the front side of the sheet 160 to electrical energy. As with all transparent sheets employed in the construction of solar panels, the sheet is preferably plain glass having a thickness of about 2 mm rather than tempered glass since the temperature associated with the processing of the photovoltaic cells thereon destroys the temper of tempered glass.

The module in FIG. 8 also includes a second or back sheet 164, also having front and back sides and edges forming a perimeter, the second sheet being disposed essentially planar to and adjacent the back side the first sheet. The sheet 164 is preferably a tempered window glass sheet having a thickness of about ⅛ inch, the tempered glass being employed to provide greater strength to the module in this embodiment.

The module further includes a reaction injection molded elastomer 170 which is seen in the Figure to have an edge portion 172 which encapsulates the perimeter edges of the first and second sheet, and a portion of the front side of the first sheet bordering the perimeter. At least the edges of the second sheet are encapsulated, although the elastomer can be continued behind the back of the sheet 164 if desired to add strength to the module.

Of particular note in this embodiment is the fact that the elastomer 170 includes a portion 174 which forms a "sandwich" between the back side of the first sheet, that is, the side which includes the cell array 162, and the front side of the second sheet 164. Preferably, this portion 174 has a thickness of from about 0.060 to about 0.10 inches, or greater, and is unitary with all edge portions 172 which form the perimeter of the module. This double sheet-elastomer core construction provides significant advantages of added strength and durability. Since tempered glass cannot be used for photovoltaic panels, modules without RIM encapsulated edges can suffer breakage of the panel simply by the torsional stress of lifting the module by one end. The single sheet RIM encapsulated panels are more durable in that the elastomer of the invention provides an advantageous soft edge for protection of the panel, but in tests breakage of an elastomer encapsulated single-panel has occurred if such a panel is dropped on a carpet from a height of twenty inches. In identical tests the double sheet-elastomer core construction module shown in FIG. 8 was dropped from a height of greater than six feet on a concrete floor without breakage of either panel.

Further, the double sheet-elastomer core construction is balanced from a thermal standpoint when sheets of comparable modulus are used in that both sheets expand or contract equally with temperature variations. In addition, the use of glass as a backing sheet is useful in that the penetration of water vapor, which penetrates polyurethane to some extent, is minimized.

The double sheet-elastomer core module may be formed in a mold similar to the mold 100 by spacing the sheet 160 from the sheet 164 with double sided tape of sufficient thickness, for example, a closed cell polyurethane foam tape with acrylic adhesive on both sides. Flow restrictors may be provided on the edges of the mold cavity, if necessary, so that flow of the elastomer precursors between the sheets is accomplished without the formation of air bubbles. Alternatively, vacuum chuck means may be provided in both of the mold sections to space the sheets sufficiently for the influx of the RIM precursors.

The module in FIG. 8 also includes an alternative connection means 180 for establishing electrical connection to the photovoltaic array 162. This connector means includes an internal portion, not specifically shown, connected to the conductors in the cell array, and an external portion which includes insulated wires 182 and 184 which are sealed in the elastomer 170, and a plug 186 comprising a shaft-like connector 188 and a shaft-receiving connector 190. A connector-receiving means is formed in the top edge 172 of the elastomer 170, and includes a first cavity portion 190 positioned where the wires exit the elastomer, a plug-receiving cavity 192, and a first wire-receiving channel 194 therebetween which includes wire retaining flanges 196.

In use, the plug 186 is connected to a mating plug which will conduct electricity from the module to an external device. These two plugs are sized so that the mated plug combination, when inserted in the cavity 192, is securely retained by the resilient elastomer 170. The wires which lead from the mating plug are retained in a second wire-receiving channel 200, including retaining flanges 202, and lead to the edge of the module. Depending upon the desired position of the module, the wires and plug 186 may lead upwards from the module as shown by the phantom lines 204 for connection to the mating plug, or behind the back of the module as displayed in that Figure.

The connector-receiving means, that is, cavities 190 and 192 and the channels 194 and 200, may be formed by the use of a mold plug of appropriate form, similar to the mold plug 140 shown in FIG. 6. The external portion of the wires 182, 184 are positioned in grooves in the outlet gate of the mold, for example, grooves with an elastomeric seal which seal tightly against the wires, and the plug 186 is positioned outside the mold cavity during the molding process.

From the foregoing description, one skilled in the art can readily ascertain the essential characteristics of the invention and, without departing from the spirit and scope thereof, can adapt the invention to various usages and conditions. Changes in form and the substitution of equivalents are contemplated as circumstances may suggest or render expedient, and although specific terms have been employed herein, they are intended in a descriptive sense and not for purposes of limitation, the purview of the invention being delineated in the following claims.

What is claimed is:

1. A method for forming an elastomeric casing on a predetermined portion of a thin film photovoltaic panel having front and back sides and edges forming a perimeter, and at least one thin film photovoltaic cell capable of converting radiation incident the front side of the panel to electrical energy, the method comprising the steps of:

placing the thin film photovoltaic panel in a mold having interior walls which cooperate with said predetermined portion of the panel to define a cavity encompassing the perimeter and the back side of the panel; and introducing a flowable reaction injection molding material into the cavity and curing said material to form a unitary elastomeric casing which encapsulates the entire back side and perimeter edges of the panel and forms a seal against a portion of the front side of the panel bordering the perimeter.

2. The method of claim 1 wherein the panel further includes means for establishing external electrical connection to the at least one thin film photovoltaic cell including an internal portion electrically connected to the at least one cell and an external portion extending from the panel, and wherein the mold includes means for defining a cavity portion which includes at least the internal portion of the connecting means of the panel, and the internal portion is embedded in the cured reaction injection molding material.

3. A method for forming an elastomeric casing on a predetermined portion of a thin film photovoltaic panel having front and back sides and edges forming a perimeter, and at least one thin film photovoltaic cell capable of converting radiation incident the front side of the panel to electrical energy, the method comprising the steps of:

placing the panel in a mold defining a chamber for receiving the panel, the mold chamber having seal means positioned to be adjacent the periphery of the front side of the panel to seal the portion of the panel located interiorly of the seal means against the influx of liquid, surfaces located exteriorly of the seal means which form a casing shaping portion which cooperates with the seal means and the predetermined portion of the panel to define a cavity within the mold chamber, and introducing the flowable reaction injection molding material into the mold and curing the material to form a unitary elastomeric casing which encapsulates the entire back side and perimeter edges of the panel and forms a seal against a portion of the front side of the panel bordering the perimeter.

4. The method of claim 3 wherein the panel includes means for establishing external electrical connection to the at least one thin film photovoltaic cell including an internal portion electrically connected to the at least one cell and an external portion extending from the panel, and wherein the casing shaping portion comprises means for defining a cavity portion which includes at least the internal portion of the connecting means of the panel, and said internal portion is embedded in the cured reaction injection molding material.

5. A method for forming an elastomeric casing on a predetermined portion of a thin film photovoltaic panel having front and back sides and edges forming a perimeter, and at least one thin film photovoltaic cell capable of converting radiation incident the front side of the panel to electrical energy, the method comprising the steps of:

placing the panel in a mold including (a) two cooperating mold sections defining a chamber for receiving the panel, (b) seal means in one of the mold sections positioned to be adjacent the periphery of the front side of the panel to support the panel within the panel-receiving chamber and seal the portion of the panel located interiorly of the seal means against the influx of fluid, (c) facing surfaces of the mold sections located exteriorly of the seal means, provided with a casing shaping portion which cooperates with the seal means and the predetermined portion of the panel to define a cavity when the mold sections are in contacting relationship, and (d) inlet means for introducing a flowable reaction injection molding material into the cavity when the mold sections are in contacting relationship; and injecting the flowable reaction injection molding material into the mold and curing the material to form a unitary elastomeric casing which encapsulates the entire back side and perimeter edges of the panel and forms a seal against a portion of the front side of the panel bordering the perimeter.

6. A method for forming an elastomeric casing on a predetermined portion of a thin film photovoltaic panel having front and back sides and edges forming a perimeter, and including (a) a first front sheet having front and back sides, and at least one thin film photovoltaic cell capable of converting radiation incident the front side of the panel to electrical energy, and (b) a second sheet disposed parallel to the first sheet, and adjacent to and spaced from the back side of the first sheet; the method comprising the steps of:

placing the panel in a mold defining a chamber for receiving the panel, the mold chamber having seal means positioned to be adjacent the periphery of the front side of the panel to seal the portion of the panel located interiorly of the seal means against the influx of liquid, surfaces located exteriorly of the seal means which form a casing shaping portion which cooperates with the seal means and the predetermined portion of the panel to define a cavity within the mold chamber, and introducing the flowable reaction injection molding material into the mold, the material flowing into the casing shaping portion and between the back side of the first sheet and the second sheet, and curing the material to form a unitary elastomeric casing which is disposed between the back side of the first sheet and the second sheet and forms a seal against a portion of the front side of the panel bordering the perimeter, continuing around the perimeter of the first sheet and sealing against at least a portion of the second sheet.

7. The method of claim 6 wherein the panel includes means for establishing external electrical connection to the at least one thin film photovoltaic cell, including an internal portion electrically connected to the at least one cell and an external portion extending from the panel, and wherein the casing shaping portion comprises means for defining a cavity portion which includes at least the internal portion of the connecting means of the panel, and said internal portion is embedded in the cured reaction injection molding material.

* * * * *